United States Patent [19]
Vinal

[11] Patent Number: 5,369,295
[45] Date of Patent: * Nov. 29, 1994

[54] FERMI THRESHOLD FIELD EFFECT TRANSISTOR WITH REDUCED GATE AND DIFFUSION CAPACITANCE

[75] Inventor: Albert W. Vinal, Cary, N.C.

[73] Assignee: Thunderbird Technologies, Inc., Research Triangle Park, N.C.

[*] Notice: The portion of the term of this patent subsequent to Mar. 16, 2010 has been disclaimed.

[21] Appl. No.: 977,689

[22] Filed: Nov. 18, 1992

Related U.S. Application Data

[63] Continuation of Ser. No. 826,939, Jan. 28, 1992, Pat. No. 5,194,923.

[51] Int. Cl.$^5$ .............................................. H01L 29/78
[52] U.S. Cl. .................................. 257/288; 257/403; 257/327
[58] Field of Search ................ 257/327, 386, 268, 403, 257/288

[56] References Cited

U.S. PATENT DOCUMENTS

| | | |
|---|---|---|
| Re. 32,800 | 12/1988 | Han et al. . |
| 3,653,978 | 4/1972 | Robinson et al. . |
| 3,789,504 | 2/1974 | Jaddam . |
| 3,872,491 | 3/1975 | Hanson et al. . |
| 4,042,945 | 8/1977 | Lin et al. . |
| 4,108,686 | 8/1978 | Jacobus, Jr. . |
| 4,274,105 | 6/1981 | Crowder et al. . |
| 4,697,198 | 9/1987 | Komori et al. . |
| 4,701,775 | 10/1987 | Cosentino et al. . |
| 4,737,471 | 4/1988 | Shirato et al. . |
| 4,819,043 | 4/1989 | Yazawa et al. . |
| 4,831,422 | 5/1989 | Ohno . |
| 4,841,346 | 6/1989 | Noguchi . |
| 4,899,202 | 2/1990 | Blake et al. . |
| 4,907,048 | 3/1990 | Huang . |
| 4,928,156 | 5/1990 | Alvis et al. . |
| 4,984,043 | 1/1991 | Vinal . |
| 4,990,974 | 2/1991 | Vinal . |
| 4,994,872 | 2/1991 | Nishizawa et al. . |
| 5,151,759 | 9/1992 | Vinal .................................. 257/403 |
| 5,194,923 | 3/1993 | Vinal .................................. 257/268 |

FOREIGN PATENT DOCUMENTS

| | | |
|---|---|---|
| 0070744 | 1/1983 | European Pat. Off. . |
| 0073623 | 3/1983 | European Pat. Off. . |
| 0274278 | 7/1988 | European Pat. Off. . |
| 3138747 | 4/1983 | Germany . |
| 55-87483 | 7/1980 | Japan . |
| 56-91473 | 7/1981 | Japan . |
| 57-10268 | 1/1982 | Japan . |
| 59-29460 | 2/1984 | Japan . |
| 61-160975 | 7/1986 | Japan . |
| 62-248255 | 10/1987 | Japan . |
| 63-53975 | 3/1988 | Japan . |
| 1097139 | 4/1987 | U.S.S.R. . |

OTHER PUBLICATIONS

*Depleted Implant* MOSFET, IBM Technical Disclosure Bulletin, vol. 32, No. 10B, Mar., 1990, pp. 235–249.
*High Performance Subhalf-Micrometer P-Channel Transistors for* CMOS VLSI, A. E. Schmitz et al.; IEDM 84, pp. 423–426, 1984.
*Characteristics of P-Channel MOS Field Effect Transistors with Ion-Implanted Channels,* Hswe, M. et al., Solid-State Electronics, vol. 15, pp. 1237–1243, 1972.

(List continued on next page.)

*Primary Examiner*—Jerome Jackson
*Assistant Examiner*—Courtney A. Bowers
*Attorney, Agent, or Firm*—Bell, Seltzer, Park & Gibson

[57] ABSTRACT

An improved Fermi FET structure with low gate and diffusion capacity allows conduction carriers to flow within the channel at a predetermined depth in the substrate below the gate, without requiring an inversion layer to be created at the surface of the semiconductor. The low capacity Fermi FET is preferably implemented using a Fermi Tub having a predetermined depth, and with a conductivity type opposite the substrate conductivity type and the same conductivity type as the drain and source diffusions.

54 Claims, 9 Drawing Sheets

OTHER PUBLICATIONS

*The Junction MOS (JMOS) Transistor–A High Speed Transistor for VLSI,* Sun, E. et al., IEEE, pp. 791–794, 1980.

*Optimization of Sub–Micron P–Channel FET Structure,* Chiang, S. et al., IEEE, pp. 534–535, 1983.

*Gate Material Work Function Considerations for 0.5 Micron CMOS,* Hillenius, S. J. et al., IEEE, pp. 147–150, 1985.

*A Normally–Off Type Buried Channel MOSFET for VLSI Circuits,* Nishiuchi, K. et al., IEDM Technical Digest, 1979, pp. 26–29.

*Ultra–High Speed CMOS Circuits in Thin SIMOX Films,* A. Kamgar et al., IEDM vol. 89, pp. 829–832, 1989.

*Fabrication of CMOS on Ultrathin SOI Obtained by Epitaxial Lateral Overgrowth and Chemical–Mechanical Polishing,* G. Shahidi, IEDM vol. 90, pp. 587–590, 1990.

*Submicron MOSFET Structure for Minimizing Channel Hot–Electron Injection,* Takeda E., et al., 1981 Symposium on VLSI Technology, Hawaii (Sep. 1981), Dig. Tech. Papers pp. 22–23.

*A New Half–Micrometer P–Channel MOSFET with Efficient Punchthrough Stops,* Odanaka S., et al., IEEE Transactions on Electron Devices, vol. ED-33, No. 3, Mar., 1986, pp. 317–321.

FERMI THRESHOLD FIELD EFFECT TRANSISTOR WITH REDUCED GATE AND DIFFUSION CAPACITANCE

CROSS REFERENCE TO RELATED APPLICATION

This application is a continuation of copending application Ser. No. 07/826,939, filed Jan. 28, 1992, now U.S. Pat. No. 5,194,923.

FIELD OF THE INVENTION

This invention relates to Field Effect Transistor devices and more particularly to high speed Field Effect Transistors having reduced gate and diffusion capacitance.

BACKGROUND OF THE INVENTION

Field Effect Transistors (FET) have become the dominant active device for very large scale integration (VLSI) and ultra large scale integration (ULSI) applications, because the integrated circuit FET is by nature a high impedance, high density, low power device. Much research and development activity has focused on improving speed and density of FET's, and on lowering the power consumption thereof. U.S. Pat. Nos. 4,984,043 and 4,990,974, both to the present inventor Albert W. Vinal, and both entitled Fermi Threshold Field Effect Transistor, describe a high speed, metal oxide semiconductor (MOS) FET which has a threshold voltage which is independent of insulator thickness, channel length, drain voltage, substrate doping and temperature to provide a high speed FET. However, notwithstanding the vast improvement of the Fermi threshold FET compared to known MOS devices, there is a continuing need to lower the capacitance of the Fermi FET structure.

SUMMARY OF THE INVENTION

It is therefore an object of the invention to provide an improved Fermi threshold Field Effect Transistor (FET).

It is another object of the invention to provide a Fermi threshold FET with reduced gate and diffusion capacitance.

These and other objects are provided, according to the present invention, by providing a Fermi-FET structure which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the dielectric constant of the substrate to calculate gate capacity. Gate capacity is thereby reduced.

The low capacity Fermi FET is preferably implemented using a Fermi Tub region having predetermined depth, and with a conductivity type opposite the substrate conductivity type and the same conductivity type as the drain and source diffusions. The Fermi Tub extends downward from the substrate surface by a predetermined depth, and the drain and source diffusions are formed in the Fermi Tub within the Tub boundaries. The preferred Fermi Tub depth is the sum of the Fermi channel depth $Y_f$ and depletion depth $Y_o$.

Accordingly, a Fermi channel region with predetermined depth $Y_f$ and width Z, extends between the source and drain diffusions. The conductivity of the Fermi channel is controlled by the voltage applied to the gate electrode. The gate capacity is thereby primarily determined by the depth of the Fermi channel and the carrier distribution in the channel and is relatively independent of the thickness of the gate oxide layer. The diffusion capacity is inversely dependent on the difference between the sum of the depth of the Fermi Tub and the depletion depth $Y_o$ in the substrate and the depth of the diffusions. A low capacity Fermi FET is thereby provided.

DESCRIPTION OF A PREFERRED EMBODIMENT

Figure 1:
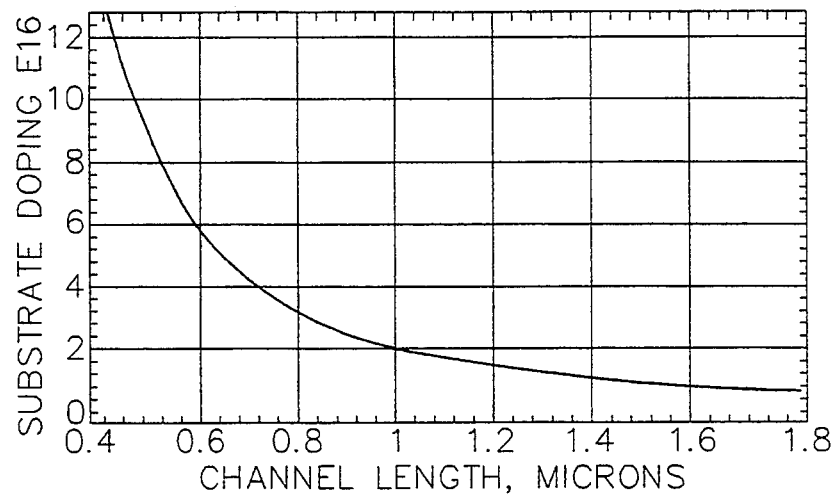
FIG. 1 graphically illustrates substrate doping as a function of channel length to maintain breakdown voltage of 8 volts.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

An improved Fermi FET structure is disclosed where gate and diffusion capacity are substantially lower than corresponding values attainable from MOS FET's and prior art Fermi FET device designs. A new Fermi FET structure is described that allows conduction carriers to flow within a channel of predetermined depth in the substrate below the gate. This new structure was conceived as a result of theory and experimentation with conventional Fermi FET and MOS FET structures. The Fermi FET structures are described in U.S. Pat. Nos. 4,990,974 and 4,984,043 the disclosures of which are incorporated herein by reference. It was discovered that certain electrical and physical conditions must be observed in order for carrier conduction to flow within a channel region at substantial depth in the substrate below the gate oxide layer. In contrast, conventional MOSFET devices require an inversion layer to be created at the surface of the semiconductor in order to support carrier conduction. The depth of the inversion layer is typically 200 Angstroms or less. Under these circumstances gate capacity is essentially the permittivity of the gate insulator layer divided by it's depth. In other words, the channel charge is so close to the surface that effects of the dielectric properties of the substrate are insignificant in affecting gate capacity. Gate capacity can only be lowered if conduction carriers are confined within a channel region below the gate where the average depth of the channel charge requires inclusion of the dielectric constant of the substrate to calculate gate capacity. In general Fast Fermi FET gate capacity is described by the following equation.

$$C_g = \frac{1}{\frac{Y_f}{\beta e_s} + \frac{T_{ox}}{e_i}} \quad (1)$$

Factor $Y_f$ is the depth of the conduction channel called the Fermi Channel, $e_s$ is the permittivity of the substrate, $\beta$ is the factor that determines the average depth of the charge flowing within the Fermi Channel below the surface. $\beta$ depends on the depth dependant profile of carriers injected from the source into the channel. For the Fast Fermi FET, $\beta \approx 2$. $T_{ox}$ is the thickness of the gate oxide layer and $e_i$ is its permittivity.

According to (1), gate capacity may be reduced by a factor of 2 by simply controlling the depth $Y_f$ of the Fermi channel and the source injection profile defined by $\beta$. Specifically, a Fast Fermi gate capacity is ½ the MOS value $e_i/T_{ox}$ when;

$$\frac{Y_f}{\beta e_s} = \frac{T_{ox}}{e_i} \quad (2)$$

For this condition, the Fermi channel depth $Y_f$ must be greater than;

$$Y_f \geq \frac{e_s T_{ox} \beta}{e_i} \quad (3)$$

Typically, $Y_f > 6T_{ox}$ for $\Theta=2$.

The conditions that allow conduction carriers to flow at substantial distances below the surface of the semiconductor are not obvious. Considerable theory supported by experimentation were required to discover the requirements. There are two primary conditions that must be observed.

1. When excess carrier conduction occurs, no perpendicular electric field component should exist in the channel region other than that produced by the excess carriers themselves.
2. The injection barrier potential $KT/q \ Ln(N_d N_c/N_i^2)$ must be reduced to zero at the bottom of the Fermi channel before the barrier is lowered at the top.
3. The dopant density within the source diffusion, as a function of depth, must decrease at a prescribed rate in order to support the proper depth profile for gate induced carrier injection into the channel.

Dynamic gate capacity can only be measured using actual transistor structures with drain voltage greater than zero. Gate area is defined by the area between the source and drain. The usual technique of measuring MOS gate capacity fails to reveal real dynamic gate capacity in Fast Fermi FET devices due to parasitic stray charge and the lack of an injection profile. Gate capacity measured from real transistors is a means of monitoring product and is used as a process control measurement.

The speed of digital circuits depends directly on diffusion depletion capacity. Low diffusion depletion capacity is inconsistent with short channel MOSFET devices. Depletion capacity is essentially the ratio of the substrate permittivity and the total depletion depth surrounding the drain or source diffusion. There are two components of diffusion depletion capacity, area and perimeter. Area capacitance occurs at the bottom of the diffusion. Perimeter capacitance is known as sidewall capacitance. Sidewall capacitance can dominate the area capacitance in MOS devices because of the increased substrate dopant adjacent the diffusions to provide channel stop regions. The Fast Fermi FET avoids the need for channel stops.

Sidewall capacity is defined below;

$$C_{dp} = C_{sw}^* [2L_d + Z] X_d \quad (4a)$$

Area capacity is defined as $$C_{da} = C_a^* L_d Z \quad (4b)$$

where;
Z = Channel width
$X_d$ = Depth of the diffusion
$L_d$ = Length of diffusion
For the Fast Fermi FET device;

$$C_{sw}^* = \frac{e_s}{Y_o + Y_p}$$

$$C_A^* = \frac{e_s}{(Y_{tub} - X_d) + Y_p}$$

Where;
$e_s$ is the permittivity of the semiconductor material and $Y_n + Y_p$ is the total depletion depth surrounding the drain or source diffusion, $Y_{Tub}$ is the depth of the Fermi Tub. $Y_o + Y_p$ is the side wall depletion depth and $X_d$ is diffusion depth.

MOS depletion depth is inversely dependant on substrate doping concentration $N_s$. In MOS devices for example a fundamental voltage breakdown condition exists called Punch-through. The substrate dopant concentration required for MOSFET's to prevent punch-through is given below as a function of channel length and breakdown voltage.

$$N_s = \frac{2e_s V_o}{q} \frac{\alpha}{1+\alpha} \left[ 1 + \sqrt{1 + \frac{V_d}{V_o}} \right]^2 \quad (5)$$

$$V_o = \frac{KT}{q} \ln\left[ \frac{N_d + N_s}{N_i^2} \right]$$

$$\alpha = \frac{N_d^+}{N_s}$$

Diffusion capacity has the following expression $$C_d = \sqrt{\frac{qN_s e_s \alpha}{2(V_o + V_d)(\alpha + 1)}} \quad (6)$$

FIG. 1 is a plot of substrate doping as a function of channel length to maintain a breakdown voltage of 8 Volts.

Figure 2:
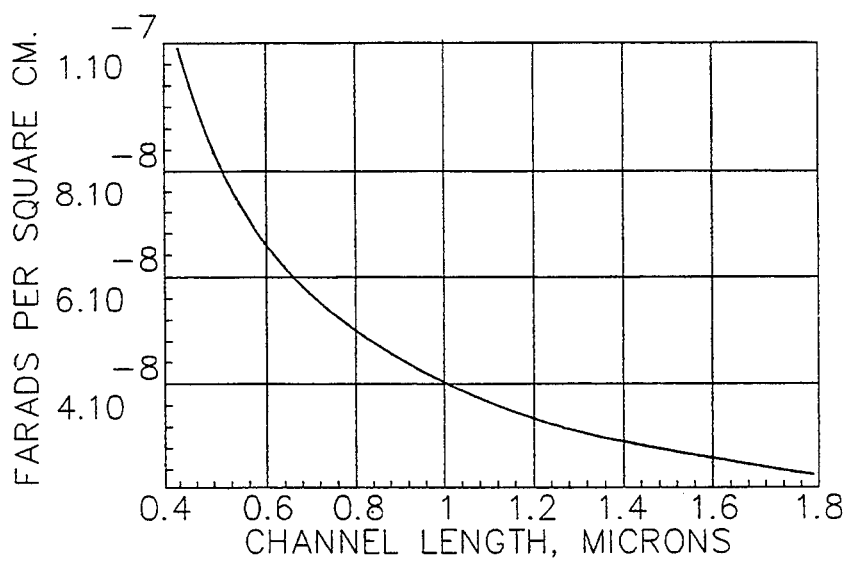
FIG. 2 graphically illustrates depletion area capacity at zero drain voltage as a function of channel length that corresponds to the doping concentration shown in FIG. 1.

FIG. 2 is a plot of Depletion area capacity (F/cm²), at zero drain voltage, as a function of channel length that corresponds to the doping concentration shown in FIG. 1

It is apparent that substrate doping requirements increase rapidly as channel length is shortened to cope with the punch-through mechanism. For short channel MOS devices (0.8 u) or less a diffusion capacity of $0.5 \times 10^{-7}$ F/cm² or greater is typical. This value of diffusion capacity is reduced by a factor of about 3 by the new Fast Fermi FET device. Punch-through is eliminated by the unique Fermi Tub method used to construct the Fast Fermi FET. Punch-through is eliminated while being tolerant of variations in diffusion depth. For short channel Fast Fermi FET devices, a substrate dopant concentration of 1E16 is typical.

The new Fast Fermi FET design simultaneously solves several fundamental problems characteristic of short channel FET devices, while providing the solution to attain low gate capacity.

1. Eliminates punch-through.
2. Virtually eliminates threshold voltage dependance on oxide thickness.
3. Dramatically lowers area and sidewall depletion capacity.
4. The Fermi Tub design greatly simplifies fabrication of P-channel devices.
5. Enhances saturation current for a given gate voltage despite the reduction of channel charge per unit gate voltage.
6. P and N channel devices use the same design criteria.
7. Maintenance of 5 volt power sources.
8. Eliminates drain induced barrier lowering commonly experienced by buried channel devices.
9. Eliminates threshold voltage off-set due to a difference in the flat-band voltage between the poly gate and substrate contacts.
10. Greatly suppresses hot electron problems.
11. Eliminates the need for channel stops.
12. Allows unique control of threshold voltage.
13. Provides for extremely low body effect.

Discussion

The operating speed of digital integrated circuits depends on 6 basic transistor parameters in addition to parasitic capacitance effects associated with interconnecting circuits. Logic circuit delay time ultimately controls the speed of integrated circuits. It can be shown that delay time in a chain of logic cells can be compiled into a single equation.

$$T_d = \frac{\phi V_{dd} L_o^2 (1 + \eta)}{I^*_{satn}} \left[ \alpha C_d^* \frac{L_d}{L_o} + \beta C_g^* + \gamma C_c^* \frac{L_c W_c}{L_o Z_o (1 + \eta)} \right] \quad (7)$$

There are six basic transistor parameters that govern logic delay time and ultimately system speed.
 1. Square channel saturation current $I^*_{satn}$. This term defines drain current that flows in an N-channel transistor whose width is equal to it's channel length with maximum gate voltage applied.
 2. Channel length $L_o$; the effective length of the conductive channel
 3. Diffusion depletion capacity $C_d^*$, Farads/cm²
 4. Gate capacity $C_g^*$, Farads/cm²
 5. Length of the diffusion $L_d$
 6. Ratio $\eta$ of an N-channel saturation current to P-channel saturation current.

Referring to Equation 7, it is clear that the coefficient for delay time depends on the square of channel length $L_o$. The coefficient also shows an inverse dependance on square channel saturation current of the N-channel device for C-MOS circuit configurations. Factor ETA, $\eta$, is also a part of the coefficient. This factor defines the ratio of N-channel to P-channel saturation currents. Parameter $\phi$ of Equation 7 is derived in U.S. Pat. No. 5,030,853 (Ring Segment Buffer) the disclosure of which is hereby incorporated herein by reference. There are three capacitive terms within the bracket term, Diffusion capacitance $C_d^*$, Gate capacitance $C_g^*$, and interconnect capacity $C_c^*$. Coefficients $\alpha$, $\beta$, and $\gamma$ account for the various logic functions within the logic chain that account for Fan-in and Fan-out for example.

There are several means available to reduce time delay in the logic chain. The usual approach is to reduce channel length, or attempt to increase drain saturation current. Scaling down transistor size to achieve shorter channel length devices unfortunately has a dramatic effect on increasing gate and depletion capacitance. See FIG. 2. Depletion capacity increases as a result of increasing substrate dopant density to prevent Punch-through in short channel devices. Gate capacity increases as a result of scaling down the thickness of the gate oxide layer Tox.

The gallium arsenide technology for example, attempts to decrease delay by increasing drive current capability. Unfortunately GaAs channel mobility, at the source end of the channel, approaches the silicon value as channel length becomes less than 0.8 microns. The tremendous DC power increase due to N-channel technology compared to C-MOS to attain speed appears to be impractical in view of FAST silicon devices.

A second and more practical approach to increasing speed of integrated circuit technology is to minimize the load capacity terms $C_d^*$, $C_g^*$, and $C_c^*$. All capacitive terms are Farads/cm². If these capacitive terms were all zero, circuit delay time would be zero independent of channel length $L_o$ or saturation current $I^*_{satn}$. The key to lowering diffusion capacity is to clearly understand and eliminate the punch-through mechanism. The Fast Fermi FET design eliminates the punch-through phenomenon and Drain Induced Barrier Lowering by use of a Fermi Tub technique that surrounds the diffusions and defines the Fermi channel region. This unique device geometry reduces gate and diffusion capacity by as much as a factor of 2.5 or more. The details of how the Fast Fermi FET lowers gate and diffusion capacity is discussed in the Fast Fermi FET Design Section.

Conductor or interconnect capacity $C_c^*$ can be lowered by increasing field oxide thickness. For a majority of digital circuit technology, interconnect capacity can be handled so as to represent about 10% of the total load capacity. In other words, if gate and diffusion capacity were eliminated altogether, system speed could be increased by a factor of 10 or more.

The key to high speed digital systems is to maximize voltage Slew Rate, the ratio of square channel current and load capacitance while minimizing power. Minimizing capacitive load (gate and depletion primarily) while maintaining or increasing drive current, is the only way to achieve high operating speed with the least power consumption. The concept of reducing gate capacity while maintaining the same drive current is intimately involved with the effect mobile carrier density in the channel has on individual mobility of carriers in the channel. Since FET drain current involves the product of gate voltage and gate capacity, or charge, the Fast Fermi FET technology achieves the same or better current capability with substantially less total charge flowing in the channel per unit current.

Fast Fermi FET Design

There is a fundamental addition to the basic Fermi FET structure disclosed in the referenced patents. This addition reduces gate and depletion capacity according to the present invention. This basic change can be seen by comparing the new structure, FIG. 5 with the prior art structures of FIG. 3 and FIG. 4.

Figure 3:
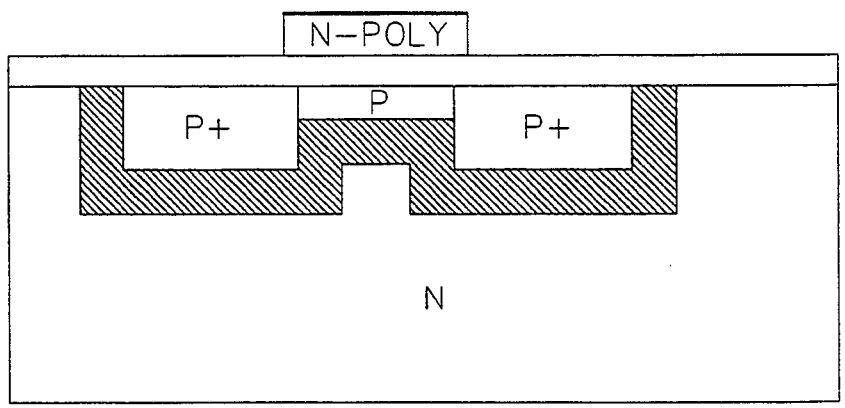
FIG. 3 is a cross-sectional view of a known buried n-channel MOSFET.

FIG. 3 illustrates a basic prior art buried P-channel MOS device. There are two fundamental problems with this prior art structure. First, voltage breakdown occurs due to the punch-through mechanism. Second, the phenomenon of drain induced barrier lowering occurs that tends to turn the channel "ON" when drain voltage is applied. Both problems are a result of diffusion-gate induced charge sharing in the substrate depletion region below the buried channel. This buried channel structure like MOS devices requires a heavily doped substrate region to minimize these effects. The result however is to dramatically increase diffusion capacity. The motivation for the shallow buried channel device apparently was an attempt to enhance saturation current for a given gate voltage.

Figure 4:
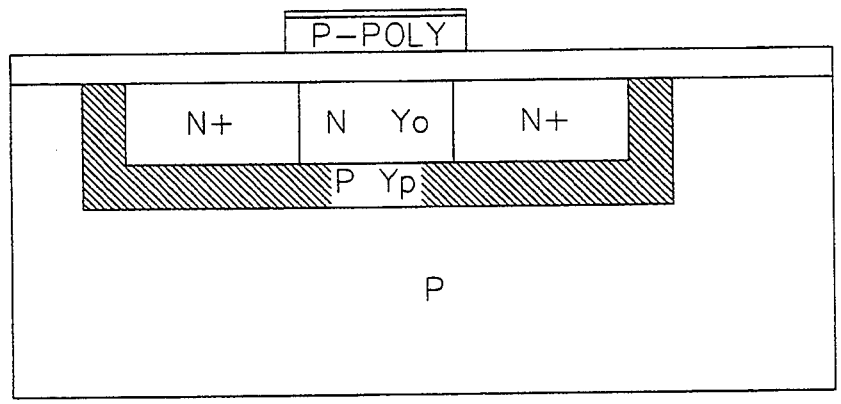
FIG. 4 is a cross-sectional view of a Fermi FET.

FIG. 4 illustrates the prior art Fermi FET structure. This device design avoids drain induced barrier lowering and punch-through when the depth of the channel $Y_o$ equals the depth of the drain and source diffusions. For this configuration, substrate doping need not be high and consequently drain diffusion capacity can be lowered. However, gate capacity for this structure is only slightly less than a MOS device despite the depth of the Fermi channel.

Figure 5:
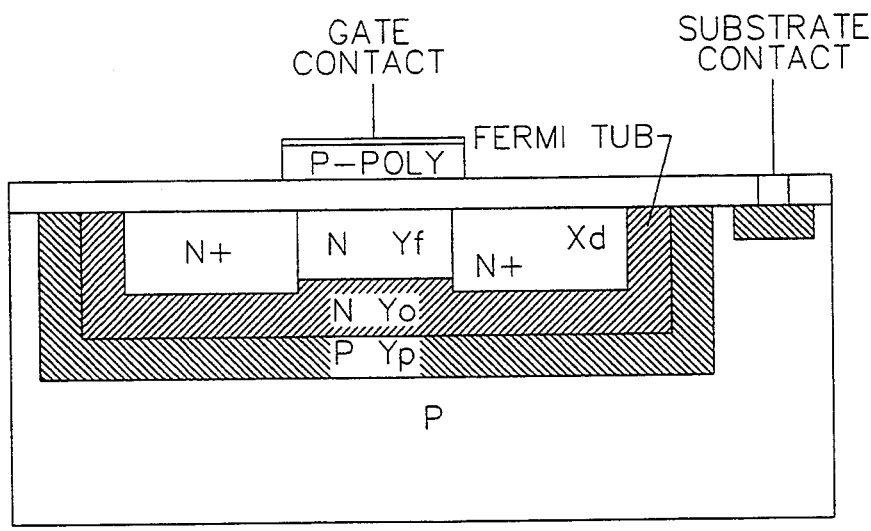
FIG. 5 is a cross-sectional view of the Fast Fermi FET according to the present invention.

The conditions required to control the distribution of charge in the channel region during conduction were unknown when the first Fermi FET device was patented. The structure of FIG. 5 depicts the basic Fast Fermi FET structure of the present invention. The basic physical difference is inclusion of a Fermi Tub region labeled in the figure. The Fermi Tub has the same conductivity type as the drain and source diffusions and has depth equal to the sum of two factors, the Fermi channel depth $Y_f$, and depletion depth $Y_o$. These depth's have specific design criteria and are discussed subsequently. With this new design, the Fermi channel $Y_f$ is capable of supporting carrier flow with a unique concentration profile throughout it's depth. This carrier concentration profile can only be achieved by the structure design of FIG. 5. This structure also satisfies all of the critical design criteria required to achieve lower gate capacity. Referring to FIG. 5, the depth of the diffusions $X_d$ must be greater than or equal to the depth of the Fermi channel $Y_f$ but not to exceed the sum $Y_f + Y_o$. Substrate depletion depth is labeled $Y_p$ in FIG. 5. The Fermi channel $Y_f$ is empty of conduction carriers for gate voltage less than threshold voltage. For this circumstances gate capacity is quite low and has the value;

$$C_g^* = \frac{1}{\frac{(Y_f + Y_o + Y_p)}{e_s} + \frac{T_{ox}}{e_i}} \quad (8)$$

Diffusion capacity per unit area is also low having the value $$C_d^* = \frac{e_s}{(Y_{tub} - X_d) + Y_p + Y_n^+} \quad (9)$$

Channel Conduction Versus Gate Voltage

Figure 6:
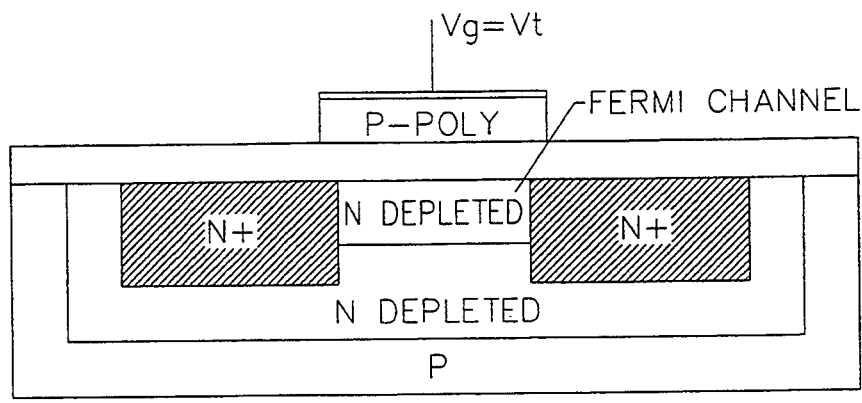
FIGS. 6–10 are cross-sectional views of channel conduction in the Fast Fermi FET of FIG. 5 with increasing gate voltage.
Figure 7:
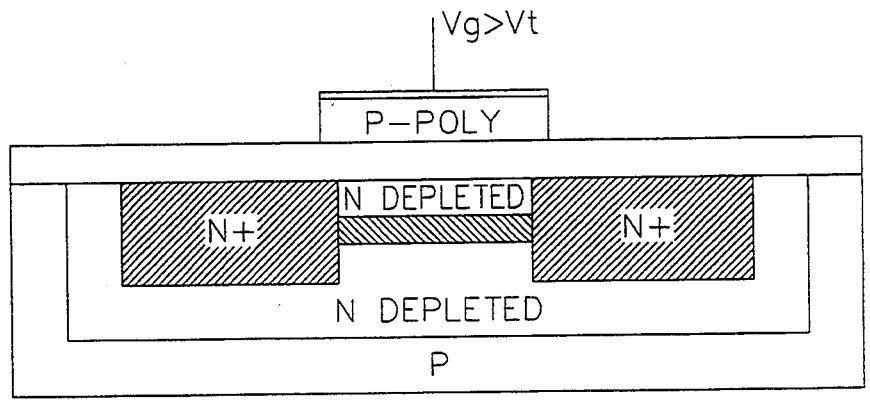
Figure 8:
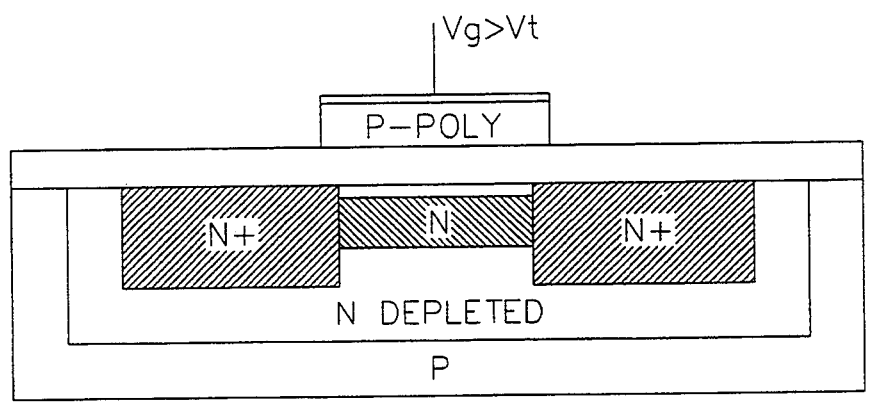
Figure 9:
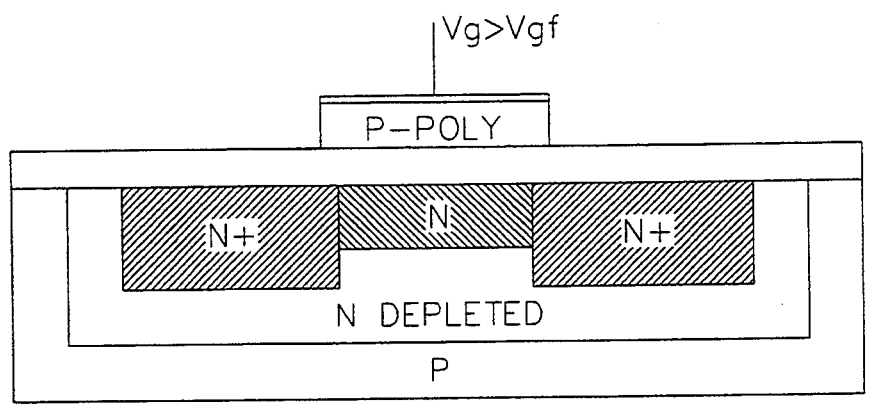
Figure 10:
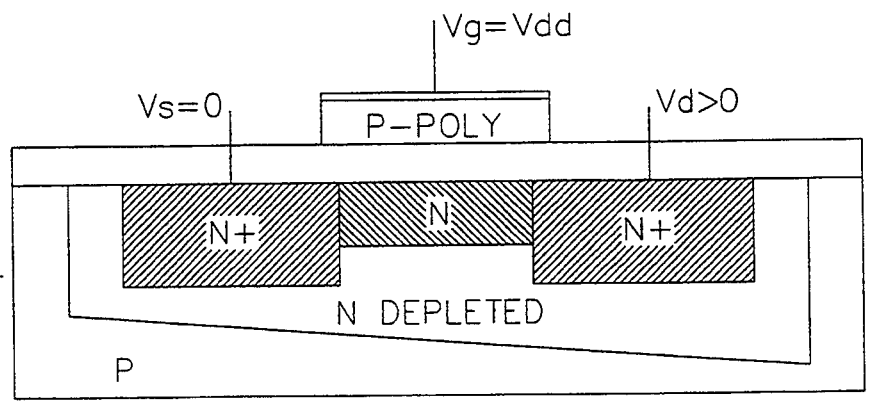

FIG. 6 through 10 depict the process of stimulating channel conduction with increasing gate voltage. All figures illustrate N-channel behavior. P-channel devices are constructed in identical fashion by changing all N conductivity type material to P type and all P type to N type. FIG. 6 illustrates the Fermi Channel completely empty of majority type carriers. FIGS. 7 through 9 illustrate ionized donors in the channel being neutralized from the bottom up allowing channel conduction to initially commence at the bottom of the Fermi channel. Excess carriers are injected from the source for larger gate voltage and have a unique distribution as shown in FIG. 10.

Source to Fermi Channel injection Profile

Carriers that flow in the channel region of any FET are injected into the channel region from the source when gate voltage is applied. Excess carrier distribution within the depth profile of the channel is prescribed by the injection mechanism. Majority carrier injection (or absorption) is a result of the electric field between the gate electrode and the surface of the source diffusion facing the channel. Carriers injected into the end of the channel from the source must not be restricted to the surface region of the channel. Instead, injection should be uniformly distributed in the depth direction of the Fermi channel. It is important that the doping profile of the source diffusion not be uniform but rather the impurity concentration should be about 2E19 at the surface and decay with depth by at least 1.0 decade between the top of the Fermi channel and its bottom. This gradient is required to achieve a useful distribution of excess carrier injection throughout the depth of the Fermi channel thus allowing significant lowering of gate capacity. Ideally it is desired that the center of mass of the excess carrier charge lie at half the depth of the Fermi channel. When the charge center lies at half the depth of the Fermi channel, Fast Fermi FET gate capacity becomes;

$$C_g^* = \frac{1}{\frac{Y_f}{2e_s} + \frac{T_{ox}}{e_i}} \qquad (10)$$

Figure 11:
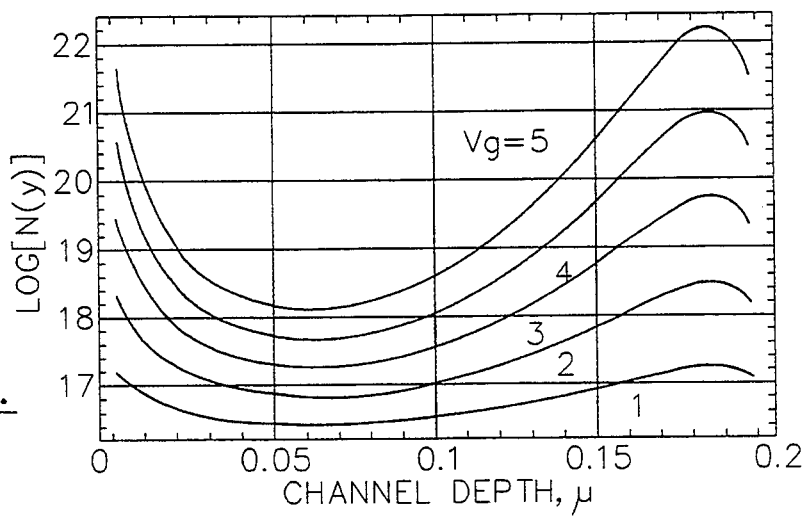
FIG. 11 graphically illustrates a profile of excess carrier injection as a function of Fermi channel depth.

A typical profile of excess carrier injection as a function of Fermi channel depth is illustrated by FIG. 11 below.

Dopant concentration at the top of the diffusion is 2E19 and 5E17 at the bottom of the channel. Notice the unique cusp type of profile. The average charge position for this cusp distribution is at approximately half the depth of the Fermi Channel.

Drain Current

Considerable theoretical and experimental work has been done to prove that drain current is not sacrificed from the MOS value by the Fast Fermi device despite substantial reduction of channel charge per unit of current. The reason is, mobility of conduction carriers increases in proportion to total charge reduction. In other words, carrier concentration is reduced with a corresponding increase in carrier mobility. Fast Fermi FET channel energy ½ $C_g V_g^2$ is reduced in proportion to the reduction of gate capacity along with switching power ½ $C_g V_g^2 f$ at frequency f.

Figure 12A:
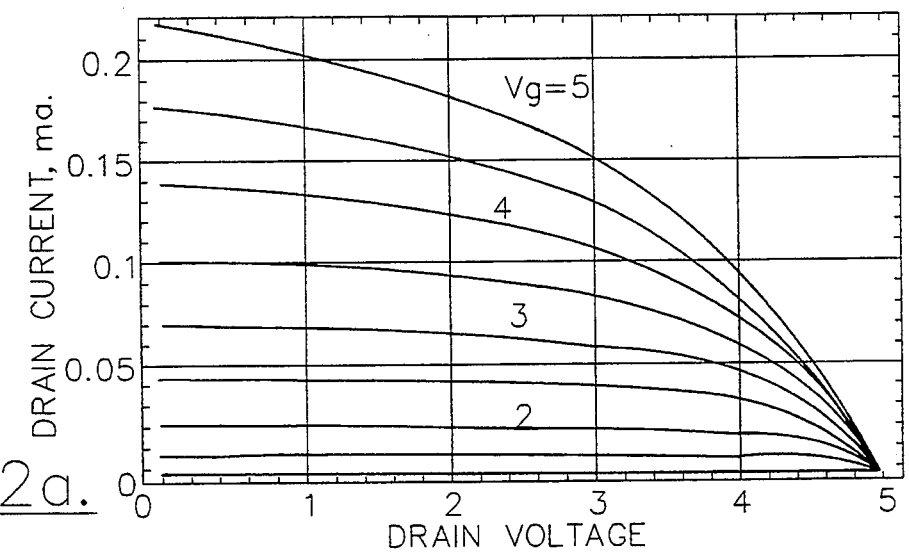
FIGS. 12a and 12b are drain current plots for P-channel MOSFETs and Fast Fermi FET devices of identical size.
Figure 12B:
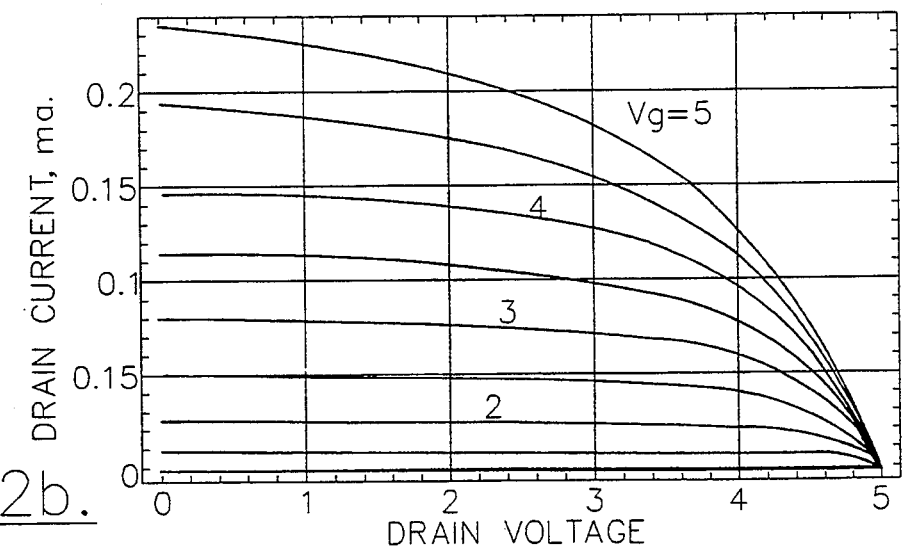

FIGS. 12a and FIG. 12b are drain current plots for P-channel MOSFET and Fast Fermi FET devices of identical size, L=Z=0.8 μ and identical oxide thickness, 165A. The substrate doping for the MOS FET is 1E17 per cm³ and 1E16 for the Fast Fermi device. Notice that the Fast Fermi FET conducts more current than the MOS device for a given gate and drain voltage despite the fact that gate and depletion capacity are 47% and 30% of the MOS values respectively. The net result is that the toggle rate of logic circuits constructed with Fast Fermi FET devices is about 2.5 times the same circuits implemented with MOS FET's for the same operating power.

Gate Capacity Measurement

There is a vast amount of information in the literature about MOS capacitance measurements. No information has been found describing gate capacity measurements using actual transistor structures. Perhaps the reasoning has been that the channel charge is so close to the surface, within a region about 200 angstroms or less, that MOS capacitors tell the story. This line of reasoning is invalid for Fast Fermi FET devices since the injection profile is adjusted for deep injection depths. The MOS capacitor technique will not reveal gate capacity of the Fast Fermi FET device. In MOS devices, injection into the ionized region below the inversion layer is insignificant because of the barrier height between the source diffusion and the ionized region facing the diffusion. Injection however does occur closer to the surface where the barrier is lowered by the inversion process.

Gate capacity measurements for the Fast Fermi FET are made using actual transistor structures. A differential capacity measurement must be made to remove capacity introduced by contact pads. This technique is simple and is used to monitor the manufacturing process. Gate area is well defined as the product of channel width $Z_c$ and channel length $L_c$. Transistor structures are required for capacity measurements since the source injection profile primarily determines the charge distribution in the channel and therefore gate capacity. This injection profile of carriers as a function of depth at the source end of the channel remains essentially unaltered in the interval between the source and drain during transit time. The reason is, there is no vertical field component across the Fermi channel other than that produced by the carriers themselves. The vertical field component resulting from Fermi Tub depletion across the substrate-Tub junction is zero at the bottom edge of the Fermi channel and remains zero throughout the depth of the channel when the Fermi channel is charge neutral.

Figure 13A:
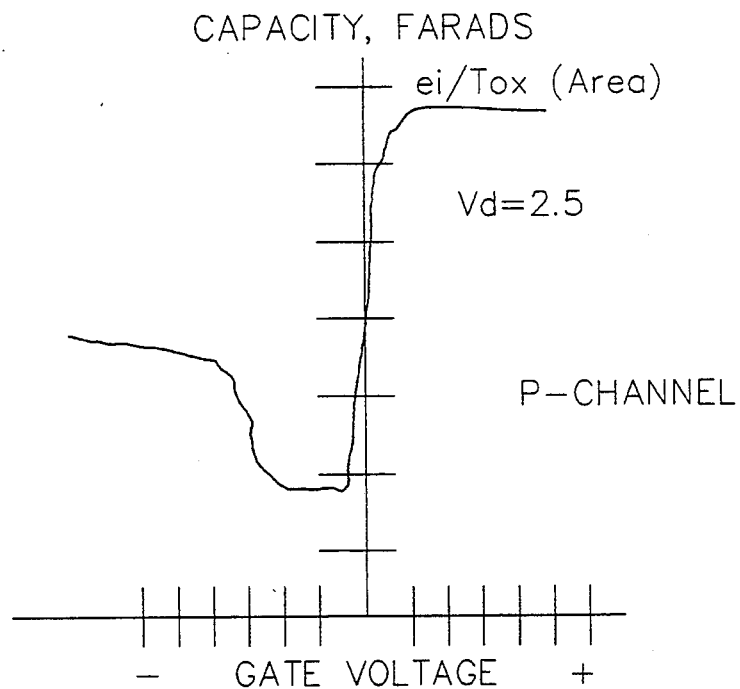
FIGS. 13a and 13b graphically illustrate gate capacity for a P-channel Fast Fermi FET and a P-channel MOSFET, respectively.
Figure 13B:
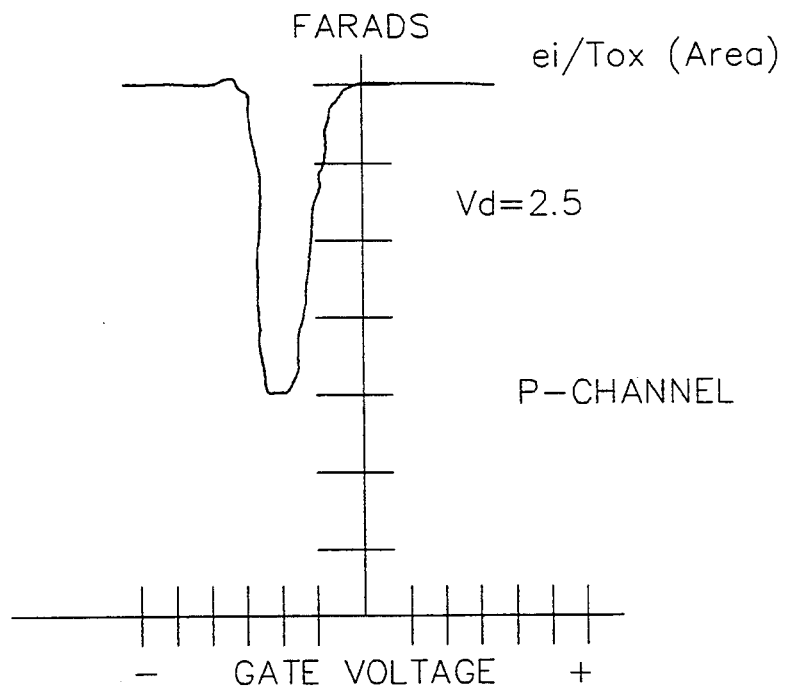

FIG. 13a is a plot of gate capacity for a P-channel Fast Fermi FET and FIG. 13b is a similar plot for a P-channel MOS device.

Referring to FIG. 13a for gate voltage with magnitude below threshold, charge inversion occurs in the Fermi Channel region. In this region of the plot gate capacity is $$C_g^* = \frac{1}{\frac{\delta}{2e_s} + \frac{T_{ox}}{e_i}} \qquad (11)$$

where δ is inversion depth.

For gate voltage near threshold, gate capacity is quite low;

$$C_g^* = \frac{1}{\frac{Y_o + Y_p + Y_f}{e_s} + \frac{T_{ox}}{e_i}} \qquad (12)$$

For gate voltage above threshold, gate capacity approaches;

$$C_g^* = \frac{1}{\frac{Y_f}{\beta e_s} + \frac{T_{ox}}{e_i}} \qquad (13)$$

Value β depends on concentration gradient within the source diffusion in the depth direction. Typically, β has the value 2.0.

FIG. 13b is a plot of dynamic gate capacitance measured for a MOS transistor. There is virtually no difference between inversion and accumulation capacity. The depth of the ionization region below the gate in the substrate determines the minimum capacity value for the MOS structure. However when inversion occurs, capacity abruptly rises to the conventional value $e_i/T_{ox}$ (Area).

In all capacitive measurements that use real transistors, drain voltage is applied to ensure removal of parasitic charge and to transport injected charge.

Figure 14:
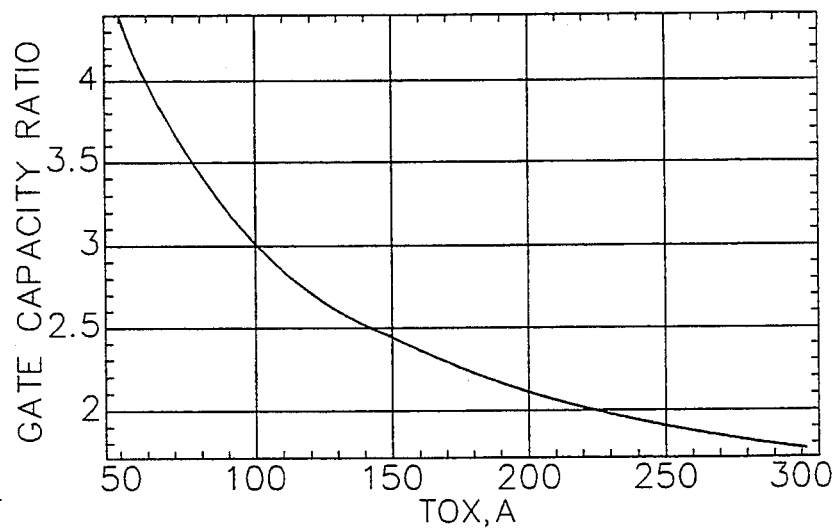
FIG. 14 is a plot of the ratio of MOS to Fermi gate capacity as a function of oxide thickness.

FIG. 14 is a plot of the ratio of MOS to Fermi gate capacity as a function of oxide thickness given a Fermi channel depth of 1200 angstroms.

Fast Fermi FET Analysis

Figure 15:
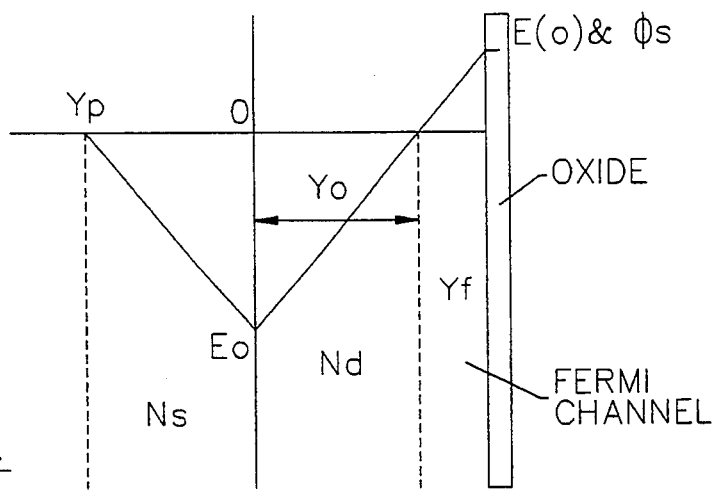
FIG. 15 depicts the electric field diagram for an N-channel Fast Fermi FET.

The conditions for channel and Tub implant that will correct for flat-band voltage difference between the poly gate and the substrate contact will now be described. Gate and diffusion capacity are decreased by controlling the depth and dose of the Fermi Tub region. FIG. 15 depicts the electric field diagram for an N-channel Fast Fermi FET that describes the mutual depletion of the Tub, channel and substrate below the gate at threshold conditions.

The electric field component in FIG. 15 that rises above the abscissa accounts for the Fermi channel depth $Y_f$ that is included in the Tub implant depth to minimize the effects of the difference between the poly gate contact and substrate contact. This channel depth defines the region that carrier conduction occurs. This Fermi channel region has substantial depth and therefore the center of mass of the conduction charge lies at a substantial depth below the surface given the correct diffusion-channel injection profile. These factors account for a substantial reduction in gate capacity. The threshold voltage of a prior art Fermi FET is twice the Fermi potential if the difference between the poly gate and substrate contact potential is Zero. However in practice, the dopant concentration in the poly gate needs to be high in order to eliminate rectifying contact problems. Therefore the differential flat-band voltage due to these contact potentials is;

$$\Delta f_b = \frac{KT}{q} \ln\left(\frac{N_p}{N_s}\right) \quad (14)$$

Where;
$N_p$ = Dopant concentration in poly gate.
$N_s$ = Dopant concentration in substrate.

This delta flat-band voltage is typically 200 millivolts. Referring to FIG. 15, the potential within the triangle region above the abscissa is;

$$\phi = \frac{\alpha q N_s}{2 e_s} Y_f^2 \quad (15)$$

Setting this potential $\phi$ to equal delta flat-band voltage $\Delta f_b$ yields a definition for the depth of the Fermi channel.

$$Y_f = \sqrt{\frac{2 e_s \Delta f_b}{\alpha q N_s}} \quad (16)$$

Where;
$\alpha = N_c/N_s$
$N_c$ = Concentration of contra doping in Fermi Tub.
$N_s$ = Substrate dopant concentration per cm$^3$ The total depth of the Fermi Tub below the gate is; $Y_{Tub} = Y_f + Y_o$; where $Y_o$ is the depletion depth in the Tub due to its contact with the substrate.

$$Y_o = \sqrt{\frac{2 e_s \phi_s}{q N_s \alpha (\alpha + 1)}} \quad (17)$$

Therefore the depth of the Fermi Tub is the sum of $Y_f$ and $Y_o$.

$$Y_{tub} = \sqrt{\frac{2 e_s}{q N_s \alpha}} \left[ \sqrt{\Delta f_b} + \sqrt{\frac{\phi_s}{(\alpha + 1)}} \right] \quad (18)$$

The prior art Fermi FET patents teach the fact that the depth of the depletion region in the substrate $Y_p$ is as follows;

$$Y_p = \sqrt{\frac{2 e_s \phi_s}{q N_s} \left(\frac{\alpha}{\alpha + 1}\right)} \quad (19)$$

Given these conditions, it is important to calculate the electric field E(0) and potential $\phi_s$ at the surface of the channel directly below the gate oxide layer at threshold. From FIG. 15 the surface field is;

$$E(o) = -\frac{q N_s}{e_s} Y_p \quad (20)$$

Since E = −gradient of potential, we calculate the potential as a function of distance y and at the surface in particular where y = 0.

$$\phi(y)_{y>0} = \frac{q N_s}{2 e_s} Y_p^2 - \int_0^{Y_o}\left(\frac{q \alpha N_s}{e_s} y - \frac{q N_s}{e_s} Y_p\right) dy \quad (21)$$

Evaluating (21) at the surface we get $$\phi(O) = \frac{q N_s}{2 e_s} [Y_p^2 - \alpha(Y_o + Y_f)^2 + 2 Y_p(Y_o + Y_f)] \quad (22)$$

Using the definitions for Yp, Yf, and Yo we find the following expression;

$$\phi(O) = \phi_s \left(\frac{\alpha}{\alpha+1}\right) - \left[\sqrt{\Delta f_b} + \sqrt{\frac{\phi_s}{\alpha+1}}\right]^2 + 2\sqrt{\frac{\phi_s}{\alpha+1}}\left[\sqrt{\Delta f_b} + \sqrt{\frac{\phi_s}{\alpha+1}}\right] \quad (23)$$

Collecting terms and simplifying we find that $$\phi(o) = \phi_s - \Delta f_b \quad (24)$$

Where;

$$\phi_s = 2\phi_f + \frac{KT}{q} \ln \alpha$$

Thus, making the Fermi Tub implant depth equal the sum $Y_o + Y_f$ reduces the surface potential by exactly the delta flat-band voltage developed between the poly gate and substrate contacts. This action forces threshold voltage to be twice the Fermi potential. In other words, including depth $Y_f$ as part of the Tub depth requirement, the delta flat-band voltage off-set is eliminated due to gate and substrate contact potential differences. The only other modification to threshold voltage for the Fast Fermi FET is a reduction in threshold voltage below twice the Fermi value by the amount of oxide potential at threshold due to flat-band compensation. Note: the direction of the oxide field is to force conduction carriers away from the oxide-silicon interface. This effect enhances the reduction of gate capacity. The oxide potential is found to be described by the following equation.

$$V_{ox} = \frac{T_{ox}}{e_i} \sqrt{2q\alpha N_s e_s \Delta fb} \tag{25}$$

Note; this oxide voltage term is opposite in polarity from that due to substrate ionization in a MOSFET device and has a relatively low value.

The threshold voltage expression for the Fast Fermi FET is given below.

$$V_t = 2\phi_f + \frac{KT}{q} \ln(\alpha) + \frac{KT}{q} \ln\left(\frac{N_{po}}{N_s}\right) - \frac{KT}{q} \ln\left(\frac{N_p}{N_s}\right) - V_{ox} \tag{26}$$

Where;
$N_p$=Poly silicon dopant accounted for
$N_{po}$=Poly silicon dopant used to construct wafers
$N_s$=substrate dopant concentration

Design Equation Summary

The following equations are used to design a Fast Fermi FET device.
Tub Implant Depth $Y_{Tub}$ Eq. (18)
Fermi Channel Depth $Y_f$ Eq. (16)
Delta Flat-band Voltage Eq. (14)
Threshold voltage Eq. (26)
Oxide Voltage Eq. (25)

Fermi Channel depth has a maximum value for Fast Fermi FET's used as enhancement devices;

$$Y_{fmax} = \sqrt{\frac{4e_s\phi_f}{\alpha q N_s}} \tag{27}$$

The predetermined diffusion to Fermi Tub side-wall spacing $Y_o$ is defined as;

$$Y_o = \sqrt{\frac{2e_s\phi_s}{qN_s\alpha(\alpha + 1)}}$$

Figure 16:
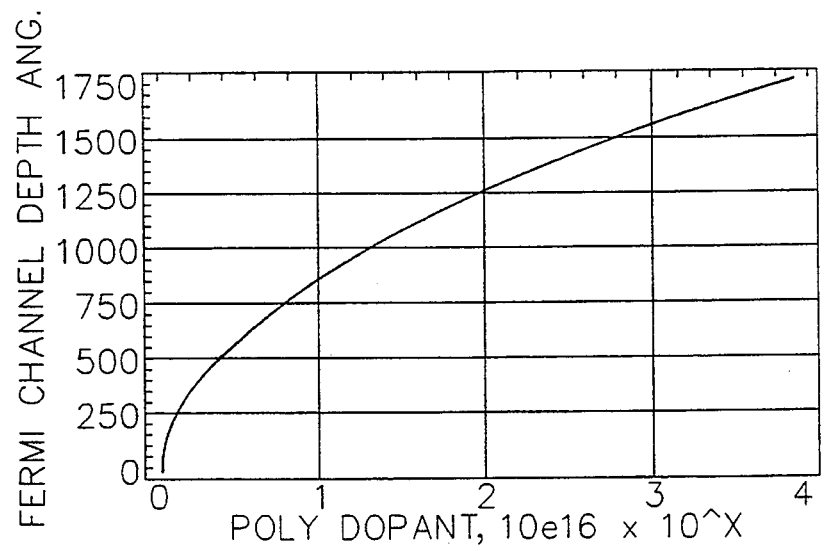
FIG. 16 graphically illustrates Fermi channel depth as a function of poly dopant concentration.
Figure 17:
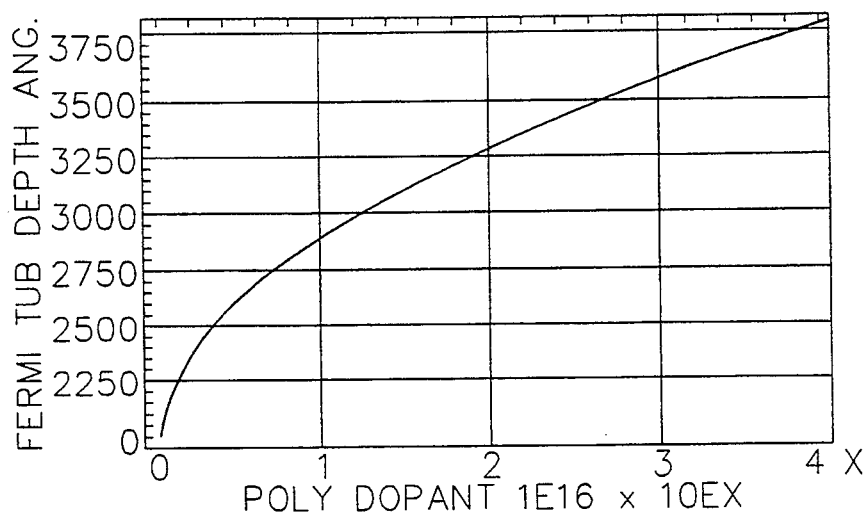
FIG. 17 graphically illustrate Fermi Tub depth versus poly dopant concentration.
Figure 18:
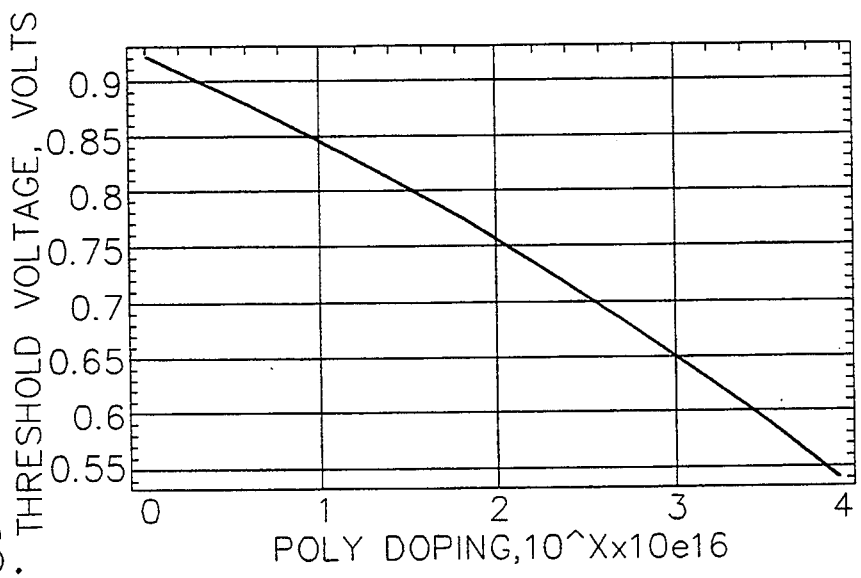
FIG. 18 graphically illustrates threshold voltage versus poly dopant concentration.

FIG. 16 is Fermi channel depth plotted as a function of the poly dopant concentration used to compensate the Fermi Tub implant depth to partially compensate for the flat-band voltage condition arising from the difference between the actual poly gate and substrate contact potential. FIG. 17 is a plot of the Fermi Tub depth for the same condition. FIG. 18 is a plot of threshold voltage for the same criteria. In all cases the substrate dopant is 1E16 per cubic cm. and $\alpha=1$.

The best design procedure is to first choose the desired threshold voltage. This choice defines the poly dopant compensation, the abscissa value corresponding to the chosen threshold voltage. For example, a threshold voltage of 0.75 Volts requires a compensation value of 1E18 for the poly dopant value to be used to define the Fermi Tub depth of 3300 A. The Fermi channel depth for this threshold voltage is 1245A.

Figure 19:
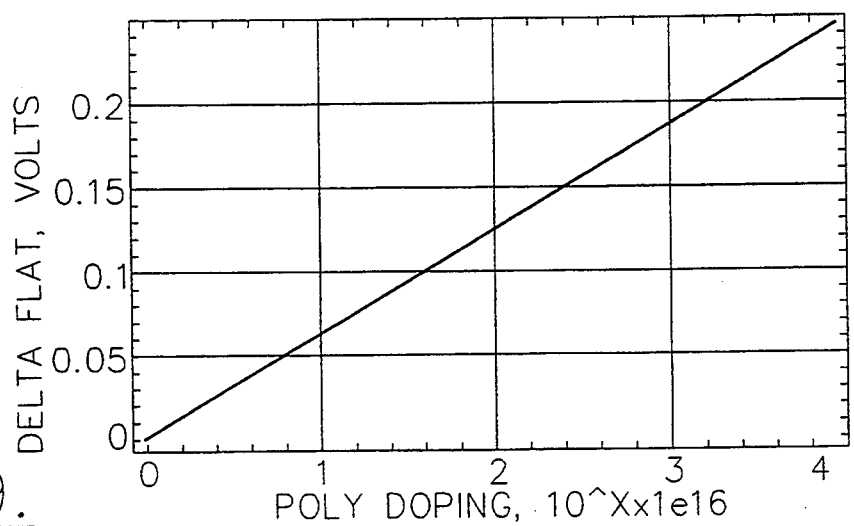
FIG. 19 illustrates delta flatband voltage versus poly dopant concentration.

FIG. 19 is a plot of the delta flat-band voltage that will prevail for a given abscissa value. In all FIGS. 16 through FIG. 19 the actual poly dopant used to fabricate the chip is 6E19.

Diffusion Depletion Capacity

Figure 20:
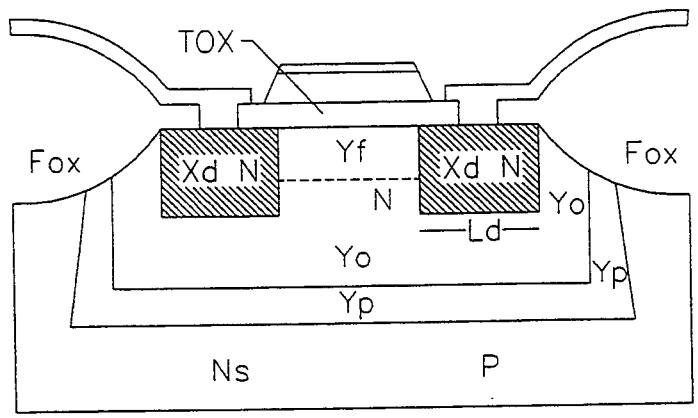
FIG. 20 is a cross-sectional view of the depletion region surrounding the diffusions that are provided by the Fermi Tub.

There are two diffusion depletion capacitance values that must be lowered from MOS values in order to achieve high speed switching. They are area and side-wall capacity. FIG. 20 illustrates the depletion regions surrounding the diffusions that are provided by the Fermi Tub technology.

The diffusion area capacity occurs at the bottom of the diffusion and for all practical purposes has the following value.

$$C_{da} = \frac{e_s}{Y_{tub} - X_d + Y_p} (L_d Z) \tag{28}$$

Diffusion side-wall capacity has the value;

$$C_{dsw} = \frac{e_s}{Y_o + Y_p} X_d(Z + 2L_d) \tag{29}$$

Where;
$Y_{Tub}$=Depth of implanted Fermi Tub
$X_d$=diffusion depth
$Z$=diffusion width
$L_d$=length of the diffusion The total side-wall depletion depth $Y_o + Y_p$ is deep enough to reduce or eliminate the need for high capacity channel stopping techniques. Channel stopping is normally used in MOS FET devices to prevent surface inversion and current leakage beyond the diffusion bounds as the field oxide region increases depth away from the diffusion edge. The depletion depth in the Fast Fermi device is deep enough that field oxide substantially reaches final value within the bounds of the depletion depth $Y_o + Y_p$. Surface inversion occurs when;

$$V_{ox} = \phi_s = \frac{F_{ox}}{e_i} \sqrt{4qN_s e_s \frac{KT}{q} \ln\left(\frac{N_s}{N_i}\right)} \tag{30}$$

Surface inversion occurs when metal voltage is 11 volts above ground potential at 30° C. given;
Fox ($F_{ox}$)=8000 Å
$e_i$=3.45E-13 F/cm
$N_a$=1E16 cm$^{-3}$
$N_i$=1.5E10 cm$^{-3}$

Body Effect

Figure 21A:
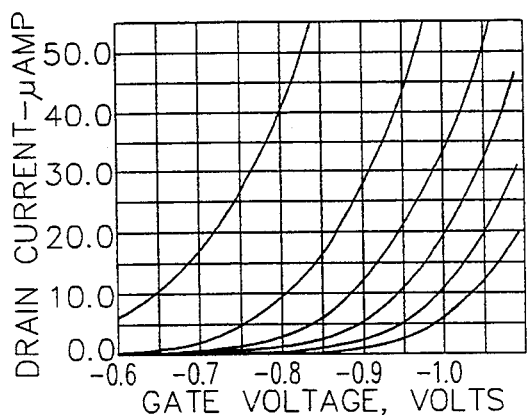
FIGS. 21a–21d illustrate measured substrate body effect and measured source body effect for conventional MOSFETs and for the Fermi FET transistor.
Figure 21B:
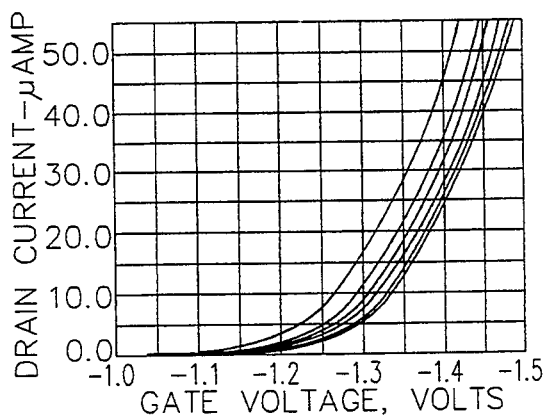
Figure 21C:
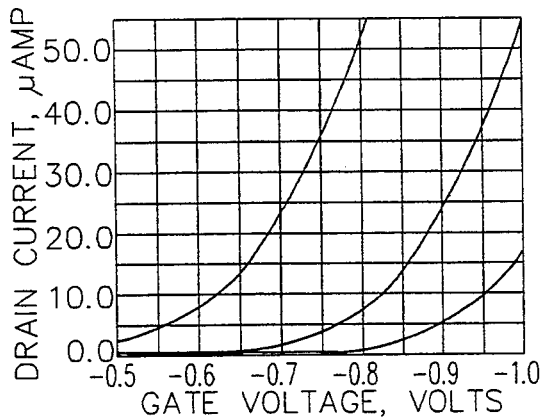
Figure 21D:
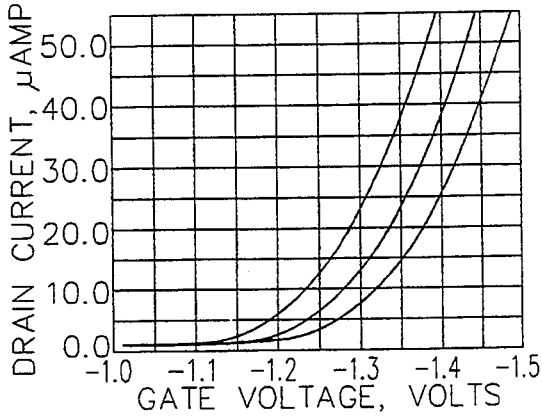

Understanding threshold voltage and its dependance on substrate and or source voltage is vital to proper simulation of circuit behavior particularly for high speed circuits. There appears to be some confusion in the technical community with regard to specifying and understanding a threshold voltage term called gamma, $\gamma$, and how this term relates to body effect. It is assumed for example that $\gamma$ is directly proportional to body effect. Its value is usually specified differently than the source equation requires in order to satisfy measured results. There is another problem with $\gamma$ dependant notions. The body effect with respect to source voltage is not the same as substrate voltage body effects. This discrepancy can be observed experimentally. For example, FIG. 21a and FIG. 21c illustrate drain current turnon with gate voltage for a MOS device for different applied step values of substrate voltage (0→5 V.) FIG. 21a, or source voltage FIG. 21c. It can be seen that the body effect with respect substrate voltage dVt/dVsub is less than the source voltage body effect d(Vt−Vs)/dVs.

The apparent difference is about a factor of 1.5. The same phenomenon occurs in Fermi FET devices. However both Fermi FET body effect values are about 1/5 as great as those measured for MOS devices. FIGS. 21a through FIG. 21d compare substrate and source voltage P-channel body effects for both technologies. Device construction were similar. Low body effect is a measurable and distinguishing factor for Fermi FET devices and becomes more pronounced as channel length is shortened. The most significant being a low body effect due to applied source voltage.

MOS Body Effect Analysis

By definition, body effect due to substrate voltage is the partial derivative of threshold voltage with respect to substrate voltage, not the partial derivative of oxide potential with respect to substrate voltage. Substrate voltage influences both surface potential and oxide potential. The term $\gamma$ is nothing more than a convenient means of simplifying the body effect equation. By common practice $\gamma$ is expressed as follows;

$$\gamma = \frac{T_{ox}}{e_i} \sqrt{2qN_s e_s}$$

Figure 22:
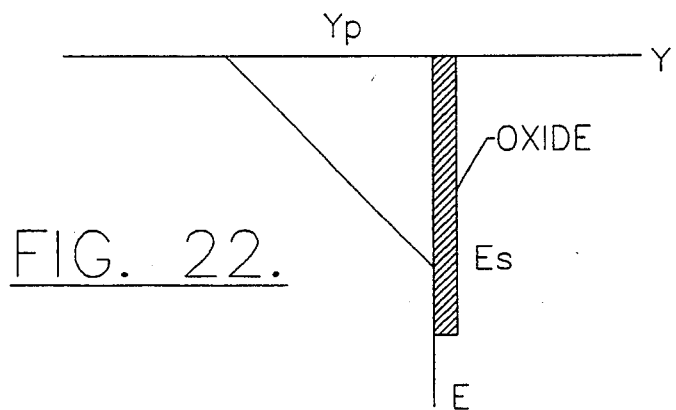
FIG. 22 illustrates the electrical field diagram for a conventional MOS device.

Where;
$T_{ox}$ = Thickness of gate oxide
$N_s$ = Substrate doping
$e_s$ = Silicon permittivity
$e_i$ = Insulator permittivity We will now derive the body effect for MOS devices. The derivation for the Fast Fermi FET is considerably more complicated and need not be presented for purposes of the present invention. Hence, only the results will be presented. FIG. 22 illustrates the electric field diagram for a MOS device for conditions below the gate oxide layer.

The depth of the depletion region in the substrate below the oxide layer is $Y_p$.

$$Y_p = \sqrt{\frac{2e_s}{qN_s}\left(\phi_s + \frac{KV_{sub}}{K+1}\right)} \quad (31)$$

The factor K related to the substrate voltage term accounts for the fact that depletion charge is coming from the inversion region, a pseudo N-type region, and terminates in the P-substrate region for an N-channel device. As we shall see, K is not a constant.

The surface field $E_s = q N_s Y_p / e_s$ is given below.

$$E_s = \sqrt{\frac{2qN_s}{e_s}\left(\phi_s + \frac{KV_{sub}}{K+1}\right)} \quad (32)$$

Using the divergence theorem at the oxide interface we obtain an expression for oxide potential.

$$V_{ox} = \frac{T_{ox}}{e_i}\sqrt{2qN_s e_s \left(\phi_s + \frac{KV_{sub}}{K+1}\right)} \quad (33)$$

or in terms of $\gamma$, $$V_{ox} = \gamma \sqrt{\phi_s + \frac{KV_{sub}}{K+1}} \quad (34)$$

The surface potential $\phi_s = q\, N_s\, Y_p^2/(2\, e_s) - V_{sub}$ has the value;

$$\rho_s = \phi_s - \frac{V_{sub}}{K+1} \quad (35)$$

Thus the surface potential is not independent of substrate voltage and consequently the body effect is not $dV_{ox}/dV_{sub}$.

We write the expression for MOS threshold voltage as $$V_t = V_{fb} + \phi_s - \frac{V_{sub}}{K+1} + \gamma\sqrt{\phi_s + \frac{KV_{sub}}{K+1}} \quad (36)$$

Where
$V_{fb}$ is the net value of flat-band voltage

Taking the partial derivative of (36) with respect substrate voltage we get the MOS FET body effect formulation.

$$\frac{\partial V_t}{\partial V_{sub}} = \frac{1}{K+1}\left[\frac{K\gamma}{2\sqrt{\frac{\phi_s + KV_{sub}}{K+1}}} - 1\right] \quad (37)$$

Since the body effect is not negative, we obtain a critical criteria from (37) for zero substrate voltage to evaluate parameter K.

$$K = \frac{2}{\gamma}\sqrt{\phi_s}\, e\sqrt{\frac{V_{sub} + \phi_s}{V_o}} \quad (38)$$

Figure 23:
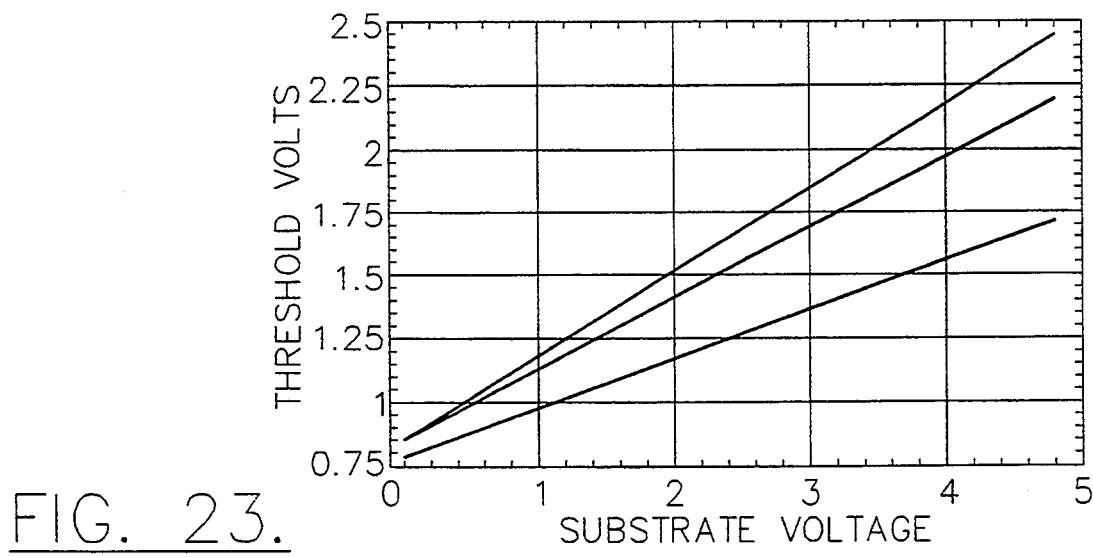
FIGS. 23 and 24 graphically illustrate threshold voltage versus substrate voltage.
Figure 24:
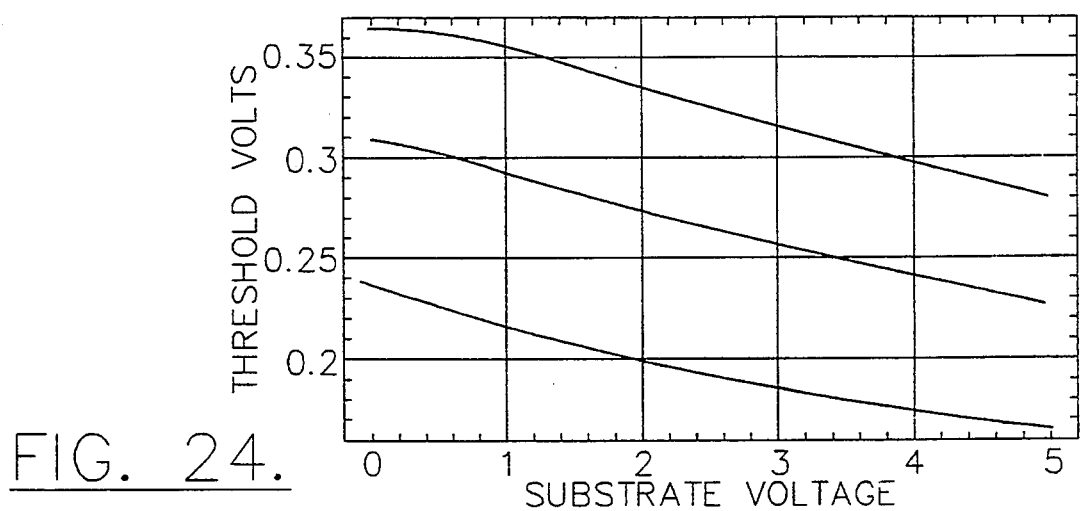

FIG. 23 is a plot of threshold voltage (36) as a function of substrate voltage and FIG. 24 is a plot of the body effect due to substrate voltage (37) for the case where $N_s$ = 1e17, 2e17 and 3e17 given gate oxide 150 Å.

By contrast, The body effect for Fast Fermi FET devices is typically 0.05 Volts/Volt or less.

The expression for Fast Fermi FET substrate body effect is given below.

Threshold voltage is;

$$V_t = V_{fb} + \phi_s + V_{ox} \quad (39)$$

Where;

$$V_{fb} = \frac{KT}{q}\ln\left(\frac{N_{pol}}{N_s}\right) \quad (40)$$

$$\rho_s = \phi_s\left[\frac{\alpha}{\alpha+1} + \frac{\theta^2}{\alpha+1} + \right. \quad (41)$$

-continued $$\frac{2\theta}{\alpha+1}\left(\sqrt{1+\frac{V_{sub}K(\alpha=1)}{\phi_s\alpha(K+1)}}-\theta\right)\right] = \frac{V_{sub}}{K+1}$$

$$V_{ox} = \gamma\sqrt{\phi_s\frac{\alpha}{\alpha+1}}\left[\sqrt{1+\frac{V_{sub}K(\alpha+1)}{\phi_s\alpha(K+1)}}-\theta\right] \quad (42)$$

Where;
The Fast Fermi Channel depth $Y_f$ is $$Y_f = Y_o(\theta-1) \quad (43)$$

Factor $\beta > 1$ for Fast Fermi FET designs. U.S. Pat. Nos. 4,990,974 and 4,984,043 call for $\theta \leq 1$.

The Fermi FET body effect can be obtained by taking the partial derivatives of (41) and (42) with respect to substrate voltage and then take the sum.

Summary

The Fast Fermi FET includes a Fermi Tub region of predetermined depth, with conductivity type opposite the substrate conductivity type and the same conductivity type as the drain and source diffusions. The Fermi Tub extends downward from the substrate surface by a predetermined depth, and the drain and source diffusions are implanted into the Fermi Tub region within the Tub boundaries. The preferred Fermi Tub depth is the sum of the Fermi channel depth $Y_f$ and depletion depth $Y_o$. A Fermi channel region with predetermined depth $Y_f$ and width Z, extends between the source and drain diffusions. The conductivity of the Fermi channel is controlled by the voltage applied to the gate electrode. The gate capacity is primarily determined by the depth of the Fermi channel and the carrier distribution in the channel and is relatively independent of the thickness of the gate oxide layer. The diffusion capacity is inversely dependant on the difference between (the sum of the depth of the Fermi Tub and the depletion depth $Y_o$ in the substrate) and the depth of the diffusions $X_d$. The diffusion depth is preferably the same depth as the Fermi channel. For deeper configurations, diffusion depth must be less than the depth of the Fermi Tub, $Y_{Tub}$. The dopant concentration for the Fermi Tub region is preferably chosen to allow the depth of the Fermi channel to be greater than three times the depth of an inversion layer within a MOS FET.

The depth of the Fermi Channel is defined as;

$$Y_f = \sqrt{\frac{2e_s}{qN_s\alpha}\frac{KT}{q}\ln\left(\frac{N_p}{N_s}\right)} \quad (44)$$

$\alpha = N_{fTub}/N_s$
$N_s$ = substrate dopant concentration
$N_p$ = Poly dopant compensation concentration
$N_{fTub}$ = Dopant concentration in Fermi Tub
$K = 1.38 \times 10^{-23}$ Joules/° Kelvin The predetermined depth of the Fermi Tub region $Y_{Tub}$ is;

$$Y_{tub} = \sqrt{\frac{2e_s}{qN_s\alpha}}\left[\sqrt{\frac{KT}{q}\ln\left(\frac{N_p}{N_s}\right)} + \sqrt{\frac{\phi_s}{\alpha+1}}\right] \quad (45)$$

Where $$\phi_s = 2\phi_f + KT/q \ln(\alpha) \quad (46)$$

The predetermined diffusion to Fermi Tub side-wall spacing $Y_o$ is defined as;

$$Y_o = \sqrt{\frac{2e_s\phi_s}{qN_s\alpha(\alpha+1)}} \quad (47)$$

The distance between the bottom of the Fermi channel and the bottom of the Fermi Tub is $Y_o$ defined above. The dopant density depth profile of the source and drain diffusions preferably must decay from the surface value and be at least one decade less in value at the bottom of the Fermi Channel. N-channel Fast Fermi FET devices require P-poly gate doping and P-channel Fast Fermi FET's require N-poly gate doping. In both cases the poly dopant concentration is preferably 5E19 or greater. The Fast Fermi FET preferably has a substrate body effect number less than 0.05 Volts per Volt.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:
1. A field effect transistor comprising:
a semiconductor substrate of first conductivity type, having a first surface;
a tub region of second conductivity type in said substrate at said first surface and extending a first predetermined depth from said first surface;
spaced apart source and drain regions of said second conductivity type in said tub region at said first surface and extending a second predetermined depth from said first surface, wherein said first predetermined depth is greater than said second predetermined depth, said tub region being free of a region of said first conductivity type between said spaced apart source and drain regions of said second conductivity type;
a channel of said second conductivity type in said tub region at said first surface, between said spaced apart source and drain regions and extending a third predetermined depth from said first surface, said third predetermined depth being less than said second predetermined depth;
a gate insulating layer on said substrate at said first surface, between said spaced apart source and drain regions; and
source, drain and gate contacts for contacting said source and drain regions and said gate insulating layer, respectively.
2. A field effect transistor comprising:
a semiconductor substrate of first conductivity type, having a first surface;
a tub region of second conductivity type in said substrate at said first surface;

spaced apart source and drain regions of said second conductivity type in said tub region at said first surface;

a channel of said second conductivity type in said tub region at said first surface, between said spaced apart source and drain regions;

a gate insulating layer on said substrate at said first surface, between said spaced apart source and drain regions; and source, drain and gate contacts for contacting said source and drain regions and said gate insulating layer, respectively;

wherein said channel extends a first predetermined depth from said first surface, wherein said tub region extends a second predetermined depth from said channel, wherein said source region extends a third predetermined depth from said first surface, and wherein said third predetermined depth is greater than said first predetermined depth and less than the sum of said first and second predetermined depths.

3. The field effect transistor of claim 2 wherein said source is doped said second conductivity type at a doping concentration which decreases from said first surface to said third predetermined depth.

4. The field effect transistor of claim 3 wherein said decreasing doping concentration defines a doping center of mass, and wherein said doping center of mass is located at a depth of one half said first predetermined depth.

5. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions; and
source, drain and gate contacts for contacting said source and drain regions and said gate insulating layer, respectively;
wherein said channel extends a first predetermined depth from said first surface and said tub region extends a second predetermined depth from said channel, at least one of said first and second predetermined depths being selected to produce zero static electric field perpendicular to said first surface at said first predetermined depth.

6. The field effect transistor of claim 5 wherein at least one of said first and second predetermined depths are further selected to produce zero static electric field perpendicular to said first surface from said first predetermined depth to said first surface, upon application of the threshold voltage of said field effect transistor to said gate contact.

7. A field effect transistor comprising:
a semiconductor substrate of first conductivity type, having a first surface;
a tub region of second conductivity type in said substrate at said first surface;

spaced apart source and drain regions of said second conductivity type in said tub region at said first surface;

a channel of said second conductivity type in said tub region at said first surface, between said spaced apart source and drain regions;

a gate insulating layer on said substrate at said first surface, between said spaced apart source and drain regions; and source, drain and gate contacts for contacting said source and drain regions and said gate insulating layer, respectively;

wherein said tub region extends a predetermined depth from said first surface, at least said predetermined depth being selected to produce a threshold voltage for said field effect transistor which is twice the Fermi potential of said semiconductor substrate.

8. The field effect transistor of claim 1 wherein at least said first predetermined depth is selected to produce a threshold voltage for said field effect transistor which is twice the Fermi potential of said semiconductor substrate.

9. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions; and
source, drain and gate contacts for contacting said source and drain regions and said gate insulating layer, respectively;
wherein said channel extends a first predetermined depth from said first surface and said tub region extends a second predetermined depth from said channel, at least one of said first and second predetermined depths being selected to allow carriers of said second conductivity type to flow from said source region to said drain region in said channel region, extending from said first predetermined depth towards said first surface upon application of voltage to said gate contact beyond the threshold voltage of said field effect transistor.

10. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a gate insulating layer on said substrate at said first surface, between said spaced apart source and drain regions; and
source, drain and gate contacts for electrically contacting said source and drain regions and said gate insulating layer, respectively;
wherein said tub region extends a predetermined depth from said first surface, at least said predetermined depth being selected to allow carriers of said second conductivity type to flow from said source region to said drain region in said tub region, extending from a second predetermined depth between said predetermined depth and said first surface towards said first surface, upon application of voltage to said gate contact beyond the threshold voltage of said field effect transistor.

11. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions; and
source, drain and gate contacts for contacting said source and drain regions and said gate insulating layer, respectively;
wherein said channel extends a first predetermined depth from said first surface and said tub region extends a second predetermined depth from said channel, at least one of said first and second predetermined depths being selected to allow carriers of said second conductivity type to flow within said channel region, from said source region to said drain region and beneath said first surface, without creating an inversion layer in said channel.

12. The field effect transistor of claim 1 wherein at least said first predetermined depth is selected to allow carriers of said second conductivity type to flow within said tub region, from said source region to said drain region and beneath said first surface, without creating an inversion layer in said tub region.

13. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions; and
source, drain and gate contacts for contacting said source and drain regions and said gate insulating layer, respectively;
wherein said channel extends a first predetermined depth from said first surface and said tub region extends a second predetermined depth from said channel, at least one of said first and second predetermined depths being selected to produce a first gate capacitance upon biasing said gate contact from below the threshold voltage of said field effect transistor to said threshold voltage, and to produce a second gate capacitance upon biasing said gate contact from above said threshold voltage to said threshold voltage.

14. The field effect transistor of claim 1 wherein at least said first predetermined depth is selected to produce a first gate capacitance upon biasing said gate contact from below the threshold voltage of said field effect transistor to said threshold voltage, and to produce a second gate capacitance upon biasing said gate contact from above said threshold voltage to said threshold voltage.

15. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions;
source, drain and gate contacts for contacting said source and drain regions and said gate insulating layer, respectively; and
a substrate contact for electrically contacting said substrate; wherein said channel extends a first predetermined depth from said first surface and said tub region extends a second predetermined depth from said channel, wherein said gate contact includes a polysilicon layer of said first conductivity type and a gate electrode on said polysilicon layer opposite said gate insulating layer; at least one of said first and second predetermined depths being selected to produce a voltage at said first surface, adjacent said gate insulating layer, which is equal and opposite to the sum of the voltage between said substrate contact and said substrate and between said polysilicon layer and said gate electrode.

16. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions;
source, drain and gate contacts for contacting said source and drain regions and said gate insulating layer, respectively; and
a substrate contact for electrically contacting said substrate; wherein said tub region extends a predetermined depth from said first surface, wherein said gate contact includes a polysilicon layer of said first conductivity type and a gate electrode on said polysilicon layer opposite said gate insulating layer; at least said predetermined depth being selected to produce a voltage at said first surface, adjacent said gate insulating layer, which is equal and opposite to the sum of the voltage between said substrate contact and said substrate and between said polysilicon layer and said gate electrode.

17. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions;
source, drain and gate contacts for contacting said source and drain regions and said gate insulating layer, respectively; and
a substrate contact for electrically contacting said substrate; wherein said channel extends a first predetermined depth from said first surface and said tub region extends a second predetermined depth from said channel, at least one of said first and second predetermined depths being selected to change the threshold voltage of said field effect transistor by less than one twentieth of a volt, when the voltage applied to said substrate contact changes by one volt.

18. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions;
source, drain and gate contacts for contacting said source and drain regions and said gate insulating layer, respectively; and
a substrate contact for electrically contacting said substrate; wherein said tub region extends a predetermined depth from said first surface, at least said predetermined depth being selected to change the threshold voltage of said field effect transistor by less than one twentieth of a volt, when the voltage applied to said substrate contact changes by one volt.

19. A field effect transistor comprising:
a semiconductor substrate of first conductivity type, having a first surface;
a tub region of second conductivity type in said substrate at said first surface;
spaced apart source and drain regions of said second conductivity type in said tub region at said first surface;
a channel of said second conductivity type in said tub region at said first surface, between said spaced apart source and drain regions;
a gate insulating layer on said substrate at said first surface, between said spaced apart source and drain regions; and
source, drain and gate contacts for contacting said source and drain regions and said gate insulating layer, respectively;
wherein said substrate is doped at a doping density $N_S$, has an intrinsic carrier concentration $N_i$ at temperature T degrees Kelvin and a permittivity $e_s$; said field effect transistor further comprising a substrate contact for electrically contacting said substrate; wherein said channel extends a first predetermined depth $Y_f$ from said first surface and said tub region extends a second predetermined depth $Y_o$ from said channel; wherein said tub region is doped at a doping density which is a factor $\alpha$ times $N_S$; wherein said gate contact includes a polysilicon layer of said first conductivity type and which is doped at a doping density $N_p$; wherein said first predetermined depth $Y_f$ is equal to $$\sqrt{\frac{2e_s}{qN_s\alpha} \frac{KT}{q} \ln\left(\frac{N_p}{N_s}\right)},$$

where q is $1.6 \times 10^{-19}$ coulombs and K is $1.38 \times 10^{-23}$ Joules/°Kelvin.

20. The field effect transistor of claim 19 wherein said second predetermined depth $Y_o$ is equal to $$\sqrt{\frac{2e_s\phi_s}{qN_s\alpha(\alpha + 1)}},$$

where $\phi_s$ is equal to $2\phi_f + KT/q \ln\alpha$, and $\phi_f$ is the Fermi potential of said semiconductor substrate.

21. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel, at least one of said first and second predetermined depths and said first and second doping densities being selected to produce zero static electric field perpendicular to said first surface at said first predetermined depth;
a gate insulating layer on said substrate at said first surface adjacent said channel; and
source, drain and gate contacts for contacting said source and drain regions and said gate insulating layer, respectively.

22. The field effect transistor of claim 21 wherein said source region extends a third predetermined depth from said first surface, and wherein said third predetermined depth is greater than said first predetermined depth and less than the sum of said first and second predetermined depths.

23. The field effect transistor of claim 22 wherein said source is doped said second conductivity type at a doping concentration which decreases from said first surface to said third predetermined depth.

24. The field effect transistor of claim 23 wherein said decreasing doping concentration defines a doping center of mass, and wherein said doping center of mass is located at a depth of one half said first predetermined depth.

25. The field effect transistor of claim 21 wherein at least one of said first and second predetermined depths and first and second doping densities are further selected to produce zero static electric field perpendicular to said first surface from said first predetermined depth to said first surface upon application of the threshold voltage of said field effect transistor to said gate contact.

26. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel, at least one of said first and second predetermined depths and said first and second doping densities being selected to produce a threshold voltage for said field effect transistor which is twice the Fermi potential of said semiconductor substrate;
a gate insulating layer on said substrate at said first surface adjacent said channel; and
source, drain and gate contacts for contacting said source and drain regions and said gate insulating layer, respectively.

27. The field effect transistor of claim 26 wherein said source region extends a third predetermined depth from said first surface, and wherein said third predetermined depth is greater than said first predetermined depth and less than the sum of said first and second predetermined depths.

28. The field effect transistor of claim 27 wherein said source is doped said second conductivity type at a doping concentration which decreases from said first surface to said third predetermined depth.

29. The field effect transistor of claim 28 wherein said decreasing doping concentration defines a doping center of mass, and wherein said doping center of mass is located at a depth of one half said first predetermined depth.

30. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel;
a gate insulating layer on said substrate at said first surface adjacent said channel; and
source, drain and gate contacts for contacting said source and drain regions and said gate insulating layer, respectively, at least one of said first and second predetermined depths and said first and second doping densities being selected to allow carriers of said second conductivity type to flow from said source region to said drain region in said channel region, extending from said first predetermined depth towards said first surface upon application of voltage to said gate contact beyond the threshold voltage of said field effect transistor.

31. The field effect transistor of claim 30 wherein said source region extends a third predetermined depth from said first surface, and wherein said third predetermined depth is greater than said first predetermined depth and less than the sum of said first and second predetermined depths.

32. The field effect transistor of claim 31 wherein said source is doped said second conductivity type at a doping concentration which decreases from said first surface to said third predetermined depth.

33. The field effect transistor of claim 32 wherein said decreasing doping concentration defines a doping center of mass, and wherein said doping center of mass is located at a depth of one half said first predetermined depth.

34. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel, at least one of said first and second predetermined depths and said first and second doping densities being selected to allow carriers of said second conductivity type to flow within said channel region, from said source region to said drain region and beneath said first surface, without creating an inversion layer in said channel;
a gate insulating layer on said substrate at said first surface adjacent said channel; and
source, drain and gate contacts for contacting said source and drain regions and said gate insulating layer, respectively.

35. The field effect transistor of claim 34 wherein said source region extends a third predetermined depth from said first surface, and wherein said third predetermined depth is greater than said first predetermined depth and less than the sum of said first and second predetermined depths.

36. The field effect transistor of claim 35 wherein said source is doped said second conductivity type at a doping concentration which decreases from said first surface to said third predetermined depth.

37. The field effect transistor of claim 36 wherein said decreasing doping concentration defines a doping center of mass, and wherein said doping center of mass is located at a depth of one half said first predetermined depth.

38. A field effect transistor comprising:
a semiconductor substrate of first conductivity type, having a first surface and being doped at a first doping density;
a tub region of second conductivity type in said substrate at said first surface being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel;
a gate insulating layer on said substrate at said first surface adjacent said channel; and
source, drain and gate contacts for contacting said source and drain regions and said gate insulating layer, respectively, at least one of said first and second predetermined depths and said first and second doping densities being selected to produce a first gate capacitance upon biasing said gate contact from below the threshold voltage of said field effect transistor to said threshold voltage, and to produce a second gate capacitance upon biasing said gate contact from above said threshold voltage to said threshold voltage.

39. The field effect transistor of claim 38 wherein said source region extends a third predetermined depth from said first surface, and wherein said third predetermined depth is greater than said first predetermined depth and less than the sum of said first and second predetermined depths.

40. The field effect transistor of claim 39 wherein said source is doped said second conductivity type at a doping concentration which decreases from said first surface to said third predetermined depth.

41. The field effect transistor of claim 40 wherein said decreasing doping concentration defines a doping center of mass, and wherein said doping center of mass is located at a depth of one half said first predetermined depth.

42. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel;
a gate insulating layer on said substrate at said first surface adjacent said channel; and
source, drain, substrate and gate contacts for contacting said source and drain regions, said substrate and said gate insulating layer, respectively, said gate contact including a polysilicon layer of said first conductivity type and a gate electrode on said polysilicon layer opposite said gate insulating layer; at least one of said first and second predetermined depths and said first and second doping densities being selected to produce a voltage at said first surface, adjacent said gate insulating layer, which is equal and opposite to the sum of the voltage between said substrate contact and said substrate and between said polysilicon layer and said gate electrode.

43. The field effect transistor of claim 42 wherein said source region extends a third predetermined depth from said first surface, and wherein said third predetermined depth is greater than said first predetermined depth and less than the sum of said first and second predetermined depths.

44. The field effect transistor of claim 43 wherein said source is doped said second conductivity type at a doping concentration which decreases from said first surface to said third predetermined depth.

45. The field effect transistor of claim 44 wherein said decreasing doping concentration defines a doping center of mass, and wherein said doping center of mass is located at a depth of one half said first predetermined depth.

46. A field effect transistor comprising:
a semiconductor substrate of first conductivity type, having a first surface and being doped at a first doping density;
a tub region of second conductivity type in said substrate at said first surface and being doped at a second doping density;
spaced apart source and drain regions of said second conductivity type in said tub region at said first surface;
a channel of said second conductivity type in said tub region at said first surface, between said spaced apart source and drain regions, said channel extending a first predetermined depth from said first surface, said tub region extending a second predetermined depth from said channel;
a gate insulating layer on said substrate at said first surface adjacent said channel; and
source, drain, substrate and gate contacts for contacting said source and drain regions, said substrate and said gate insulating layer, respectively, at least one of said first and second predetermined depths and said first and second doping densities being selected to change the threshold voltage of said field effect transistor by less than one twentieth of a volt, when the voltage applied to said substrate contact changes by one volt.

47. The field effect transistor of claim 46 wherein said source region extends a third predetermined depth from said first surface, and wherein said third predetermined depth is greater than said first predetermined depth and less than the sum of said first and second predetermined depths.

48. The field effect transistor of claim 47 wherein said source is doped said second conductivity type at a doping concentration which decreases from said first surface to said third predetermined depth.

49. The field effect transistor of claim 48 wherein said decreasing doping concentration defines a doping center of mass, and wherein said doping center of mass is located at a depth of one half said first predetermined depth.

50. A field effect transistor comprising:
a semiconductor substrate of first conductivity type, having a first surface and being doped at a doping density $N_s$, said semiconductor substrate having an intrinsic carrier concentration $N_i$ at temperature T degrees Kelvin and a permittivity $e_s$;
a tub region of second conductivity type in said substrate at said first surface and being doped at a doping density which is a factor $\alpha$ times $N_s$;
spaced apart source and drain regions of said second conductivity type in said tub region at said first surface;
a channel of said second conductivity type in said tub region at said first surface, between said spaced apart source and drain regions, and extending a first predetermined depth $Y_f$ from said first surface, said tub region extending a second predetermined depth $Y_o$ from said channel;
a gate insulating layer on said substrate at said first surface adjacent said channel; and
source, drain, substrate and gate contacts for contacting said source and drain regions, said substrate and said gate insulating layer, respectively, said gate contact including a polysilicon layer of said first conductivity type and which is doped at a doping density $N_p$, said first predetermined depth $Y_f$ being equal to $$\sqrt{\frac{2e_s}{qN_s\alpha} \cdot \frac{KT}{q} \ln\left(\frac{N_p}{N_s}\right)},$$

where q is equal to $1.6 \times 10^{-19}$ coulombs and K is equal to $1.38 \times 10^{-23}$ Joules/°Kelvin.

51. The field effect transistor of claim 50 wherein said second predetermined depth $Y_o$ is equal to $$\sqrt{\frac{2e_s\phi_s}{qN_s\alpha(\alpha + 1)}},$$

where $\phi_s$ is equal to $2\phi_f + KT/q \ln\alpha$, and $\phi_f$ is the Fermi potential of said semiconductor substrate.

52. The field effect transistor of claim 50 wherein said source region extends a third predetermined depth from said first surface, and wherein said third predetermined depth is greater than said first predetermined depth and less than the sum of said first and second predetermined depths.

53. The field effect transistor of claim 52 wherein said source is doped said second conductivity type at a doping concentration which decreases from said first surface to said third predetermined depth.

54. The field effect transistor of claim 53 wherein said decreasing doping concentration defines a doping center of mass, and wherein said doping center of mass is located at a depth of one half said first predetermined depth.

* * * * *